US009858502B2

(12) United States Patent
Moody et al.

(10) Patent No.: US 9,858,502 B2
(45) Date of Patent: *Jan. 2, 2018

(54) CLASSIFICATION OF MULTISPECTRAL OR HYPERSPECTRAL SATELLITE IMAGERY USING CLUSTERING OF SPARSE APPROXIMATIONS ON SPARSE REPRESENTATIONS IN LEARNED DICTIONARIES OBTAINED USING EFFICIENT CONVOLUTIONAL SPARSE CODING

(71) Applicant: Los Alamos National Security, LLC, Los Alamos, NM (US)

(72) Inventors: Daniela Moody, Los Alamos, NM (US); Brendt Wohlberg, Los Alamos, NM (US)

(73) Assignee: Los Alamos National Security, LLC, Los Alamos, NM (US)

( * ) Notice: Subject to any disclaimer, the term of this patent is extended or adjusted under 35 U.S.C. 154(b) by 22 days.

This patent is subject to a terminal disclaimer.

(21) Appl. No.: 15/134,437

(22) Filed: Apr. 21, 2016

(65) Prior Publication Data
US 2017/0213109 A1    Jul. 27, 2017

Related U.S. Application Data

(63) Continuation-in-part of application No. 14/668,900, filed on Mar. 25, 2015, now Pat. No. 9,684,951.
(Continued)

(51) Int. Cl.
*G06K 9/62*      (2006.01)
*G06K 9/00*      (2006.01)

(52) U.S. Cl.
CPC ........ *G06K 9/6267* (2013.01); *G06K 9/0063* (2013.01)

(58) Field of Classification Search
CPC .... G06K 9/66; G06K 9/6218; G06K 9/00797; G06K 9/00718; G06K 9/00536;
(Continued)

(56) References Cited

U.S. PATENT DOCUMENTS 5,631,970 A * 5/1997 Hsu .................... G06K 9/00476
                                                               345/61
7,196,641 B2    3/2007   Huang et al.
(Continued)

OTHER PUBLICATIONS

Alavi Amir, "Non-Final Office Action", dated Dec. 22, 2016 for U.S. Appl. No. 14/668,900.
(Continued)

*Primary Examiner* — Amir Alavi
(74) *Attorney, Agent, or Firm* — LeonardPatel PC

(57) ABSTRACT

An approach for land cover classification, seasonal and yearly change detection and monitoring, and identification of changes in man-made features may use a clustering of sparse approximations (CoSA) on sparse representations in learned dictionaries. The learned dictionaries may be derived using efficient convolutional sparse coding to build multispectral or hyperspectral, multiresolution dictionaries that are adapted to regional satellite image data. Sparse image representations of images over the learned dictionaries may be used to perform unsupervised k-means clustering into land cover categories. The clustering process behaves as a classifier in detecting real variability. This approach may combine spectral and spatial textural characteristics to detect geologic, vegetative, hydrologic, and man-made features, as well as changes in these features over time.

20 Claims, 4 Drawing Sheets

Related U.S. Application Data which is a continuation-in-part of application No. 15/133,387, filed on Apr. 20, 2016.

(60) Provisional application No. 61/972,779, filed on Mar. 31, 2014, provisional application No. 62/149,933, filed on Apr. 20, 2015.

(58) Field of Classification Search
CPC .. G06K 9/0063; G06K 9/6255; G06K 9/6267; G06F 17/30257; G06F 17/3024; H04N 1/40062

See application file for complete search history.

(56) References Cited

U.S. PATENT DOCUMENTS

| | | | |
|---|---|---|---|
| 7,271,747 | B2 | 9/2007 | Baraniuk et al. |
| 7,970,209 | B2 | 6/2011 | Yoon et al. |
| 8,538,200 | B2 | 9/2013 | Wang et al. |
| 8,693,765 | B2 | 4/2014 | Mercier et al. |
| 9,311,531 | B2* | 4/2016 | Amtrup ............. G06K 9/00442 |
| 9,313,072 | B2 | 4/2016 | Katabi et al. |
| 9,684,951 | B2* | 6/2017 | Wohlberg .............. G06T 5/004 |
| 2012/0065924 | A1* | 3/2012 | Nielsen ................ G01J 3/0264 702/135 |
| 2015/0154465 | A1* | 6/2015 | Gueguen ............ G06K 9/0063 382/195 |
| 2015/0170526 | A1* | 6/2015 | Wang ..................... B64C 19/00 701/16 |
| 2016/0307073 | A1* | 10/2016 | Moody ............... G06K 9/0063 |
| 2017/0075872 | A1* | 3/2017 | Tong ................... G06F 17/2765 |
| 2017/0098122 | A1* | 4/2017 | el Kaliouby ....... G06K 9/00308 |

OTHER PUBLICATIONS

Amir Alavi, "Restriction Requirement", dated Oct. 21, 2016 for U.S. Appl. No. 14/668,900.
A. D. Szlam et al., "Convolutional Matching Pursuit and Dictionary Training," CoRR, (Oct. 3, 2010).
A. M. Bruckstein et al., "From Sparse Solutions of Systems of Equations to Sparse Modeling of Signals and Images," SIAM Review, vol. 51, No. 1, pp. 34-81 (2009).
B. A. Olshausen et al., "Learning Sparse Image Codes Using a Wavelet Pyramid Architecture," Adv. Neural Inf. Process. Syst., vol. 13, pp. 887-893 (2000).
B. Mailhe et al., "Dictionary Learning with Large Step Gradient Descent for Sparse Representations," Latent Variable Analysis and Signal Separation, ser. Lecture Notes in Computer Science, F. J. Theis et al., Eds. Springer Berlin Heidelberg, vol. 7191, pp. 231-238 (2012).
B. Ophir et al., "Multi-Scale Dictionary Learning Using Wavelets," IEEE J. Sel. Topics Signal Process., vol. 5, No. 5, pp. 1014-1024 (Sep. 2011).
B.S. He et al., "Alternating Direction Method with Self-Adaptive Penalty Parameters for Monotone Variational Inequalities," Journal of Optimization Theory and Applications, vol. 106, No. 2, pp. 337-356 (Aug. 2000).
C. Rusu et al., "Explicit Shift-Invariant Dictionary Learning," IEEE Signal Process. Lett., vol. 21, No. 1, pp. 6-9 (Jan. 2014).
H. Bristow et al., "Fast Convolutional Sparse Coding," Proceedings of the IEEE Conference on Computer Vision and Pattern Recognition (CVPR), pp. 391-398 (Jun. 2013).
J. Eckstein, "Augmented Lagrangian and Alternating Direction Methods for Convex Optimization: A Tutorial and some Illustrative Computational Results," Rutgers Center for Operations Research, Rutgers University, Rutcor Research Report RRR 32-2012, http://rutcor.rutgers.edu/pub/rrr/reports2012/32 2012.pdf (Dec. 2012).
J. Mairal et al., "Non-Local Sparse Models for Image Restoration," Proceedings of the IEEE International Conference on Computer Vision (CVPR), pp. 2272-2279 (2009).
J. Mairal et al., "Task-Driven Dictionary Learning," IEEE Transactions on Pattern Analysis and Machine Intelligence, vol. 34, No. 4, pp. 791-804 (Apr. 2012).
J. Yang et al., "Supervised Translation-Invariant Sparse Coding," Proceedings of the IEEE Conference on Computer Vision and Pattern Recognition (CVPR), pp. 3517-3524 (2010).
K. Engan et al., "Method of Optimal Directions for Frame Design," Proceedings of the IEEE International Conference on Acoustics, Speech, and Signal Processing (ICASSP), vol. 5, pp. 2443-2446 (1999).
K. Kavukcuoglu et al., "Learning Convolutional Feature Hierachies for Visual Recognition," Advances in Neural Information Processing Systems (NIPS) (2010).
K. Skretting et al., "General Design Algorithm for Sparse Frame Expansions," Signal Process., vol. 86, No. 1, pp. 117-126, (Jan. 2006).
K. Skretting et al., "Image Compression Using Learned Dictionaries by RLS-DLA and Compared with K-SVD," Proc. IEEE Int. Conf. Acoust. Speech Signal Process. (ICASSP), pp. 1517-1520 (May 2011).
M. D. Zeiler et al., "Adaptive Deconvolutional Networks for Mid and High Level Feature Learning," Proc. IEEE Int. Conf. Comp. Vis. (ICCV), pp. 2018-2025 (2011).
M. D. Zeiler et al., "Deconvolutional Networks," Proceedings of the IEEE Conference on Computer Vision and Pattern Recognition (CVPR), pp. 2528-2535 (Jun. 2010).
M. Pachitariu et al., "Extracting Regions of Interest from Biological Images with Convolutional Sparse Block Coding," Adv. Neural Inf. Process. Syst., vol. 26, pp. 1745-1753 (2013).
M. S. Lewicki et al., "Coding Time-Varying Signals Using Sparse, Shift-Invariant Representations," Adv. Neural Inf. Process. Syst., vol. 11, pp. 730-736 (1999).
M. V. Afonso et al., "Fast Image Recovery Using Variable Splitting and Constrained Optimization," IEEE Trans. Image Process., vol. 19, No. 9, pp. 2345-2356 (2010).
Manya V. Afonso et al., "An Augmented Lagrangian Approach to the Constrained Optimization Formulation of Imaging Inverse Problems," IEEE Transactions on Image Processing, vol. 20, No. 3 (Mar. 2011).
N. Egidi et al., "A Sherman-Morrison Approach to the Solution of Linear Systems," Journal of Computational and Applied Mathematics, vol. 189, No. 1-2, pp. 703-718 (May 2006).
R. Chalasani et al., "A Fast Proximal Method for Convolutional Sparse Coding," Proceedings of the International Joint Conference on Neural Networks (IJCNN), pp. 1-5 (Aug. 2013).
R. Grosse et al., "Shift-Invariant Sparse Coding for Audio Classification," Proc. Twenty-Third Conf. on Uncertainty in Artificial Intel. (UAI), pp. 149-158 (Jul. 2007).
S. Boyd et al., "Distributed Optimization and Statistical Learning via the Alternating Direction Method of Multipliers," Foundations and Trends in Machine Learning, vol. 3, No. 1, pp. 1-122 (2010).
S. S. Chen et al., "Atomic Decomposition by Basis Pursuit," SIAM Journal on Scientific Computing, vol. 20, No. 1, pp. 33-61 (1998).
T. Blumensath et al., "On Shift-Invariant Sparse Coding," Independent Component Analysis and Blind Signal Separation, ser. Lecture Notes in Computer Science, vol. 3195, pp. 1205-1212 (2004).
T. Blumensath et al., "Shift-Invariant Sparse Coding for Single Channel Blind Source Separation," Signal Processing with Adaptative Sparse Structured Representations (SPARS) (Nov. 2005).
T. Blumensath et al., "Sparse and Shift-Invariant Representations of Music," IEEE Trans. Audio, Speech, Language Process., vol. 14, No. 1, pp. 50-57 (Jan. 2006).
T. Blumensath et al., "Unsupervised Learning of Sparse and Shift-Invariant Decompositions of Polyphonic Music," Proc. IEEE Int. Conf. Acoust. Speech Signal Process. (ICASSP), vol. 5, pp. 497-500 (May 2004).
W. W. Hager, "Updating the Inverse of a Matrix," SIAM Review, vol. 31, No. 2, pp. 221-239 (Jun. 1989).
Y. Boureau et al., "Learning Mid-Level Features for Recognition," Proceedings of the IEEE Conference on Computer Vision and Pattern Recognition (CVPR), pp. 2559-2566 (Jun. 2010).
Amir Alavi, "Notice of Allowance", dated Apr. 11, 2017 for U.S. Appl. No. 14/668,900.

(56) References Cited

OTHER PUBLICATIONS

Edward Park, "Restriction Requirement Office Action", dated Jul. 18, 2017, U.S. Appl. No. 15/133,387.

* cited by examiner

CLASSIFICATION OF MULTISPECTRAL OR HYPERSPECTRAL SATELLITE IMAGERY USING CLUSTERING OF SPARSE APPROXIMATIONS ON SPARSE REPRESENTATIONS IN LEARNED DICTIONARIES OBTAINED USING EFFICIENT CONVOLUTIONAL SPARSE CODING

CROSS REFERENCE TO RELATED APPLICATION

This application is a continuation-in-part of U.S. patent application Ser. No. 14/668,900 filed Mar. 25, 2015, which claims the benefit of U.S. provisional patent application No. 61/972,779 filed Mar. 31, 2014, and is also a continuation-in-part of U.S. patent application Ser. No. 15/133,387 filed Apr. 20, 2016, which claims the benefit of U.S. provisional patent application No. 62/149,933 filed Apr. 20, 2015. The subject matter of these earlier filed applications is hereby incorporated by reference in its entirety.

STATEMENT OF FEDERAL RIGHTS

The United States government has rights in this invention pursuant to Contract No. DE-AC52-06NA25396 between the United States Department of Energy and Los Alamos National Security, LLC for the operation of Los Alamos National Laboratory.

FIELD

The present invention generally relates to image analysis, and more specifically, to performing unsupervised classification of land cover in multispectral or hyperspectral satellite imagery using clustering of sparse approximations (CoSA) on sparse representations in learned dictionaries. The sparse representations, the learned dictionaries, or both, may be obtained using efficient convolutional sparse coding.

BACKGROUND

Machine vision and pattern recognition algorithms are of interest for applications related to climate change monitoring, change detection, and Land Use/Land Cover (LULC) classification using satellite image data. However, these approaches frequently are not robust for multiple classes that are spatially mixed. Furthermore, despite the vast archives of globally distributed remotely sensed data collected over the last four decades and the availability of computing resources to process these datasets, global assessment of all but the simplest landscape features is not currently possible.

A fundamental problem to creating scalable feature extraction technology capable of processing imagery datasets at global scales is the overconstrained training needed to generate effective solutions. Many features of environmental importance including, but not limited to, rivers, water bodies, coastlines, glaciers, and vegetation boundaries, are readily recognizable to humans based on a simple set of attributes. The very best of current feature extraction software, e.g., the Los Alamos National Laboratory-developed GeniePro™, however, requires extensive, image-specific training that leads to a solution with limited applicability to images other than the image used for training.

Accordingly, developing automatic, unsupervised feature extraction and high-resolution, pixel-level classification tools that do not require overconstrained training may be beneficial and have a significant impact for a number of application areas, e.g., for studying climate change effects and providing the climate change community with more exact ways of detecting yearly and seasonal changes.

SUMMARY

Certain embodiments of the present invention may provide solutions to the problems and needs in the art that have not yet been fully identified, appreciated, or solved by conventional image analysis technologies. For example, some embodiments of the present invention pertain to a classifier that performs unsupervised classification of land cover in multispectral or hyperspectral satellite imagery using clustering of sparse approximations (CoSA) on convolutional sparse representations in learned dictionaries.

In an embodiment, a computer-implemented method includes learning representative land features, by a computing system, from multi-band images comprising image data to form a learned dictionary $\{g_m\}$. The computer-implemented method also includes computing a sparse representation with respect to the learned dictionary and clustering features of the sparse representation of the image, by the computing system, into land cover categories. The computer-implemented method further includes performing land cover classification and change detection in a sparse domain, by the computing system, after the image is clustered and outputting results of the land cover classification and change detection in the sparse domain, by the computing system.

In another embodiment, a computer program is embodied on a non-transitory computer-readable medium. The program configured to cause at least one processor to form a learned dictionary by computing the dictionary in a frequency domain by using coefficient maps, using an iterated Sherman-Morrison algorithm for a dictionary update, and output a dictionary when stopping tolerances are met. The computer program is also configured to cause the at least one processor to compute a sparse representation with respect to the learned dictionary and to cluster feature vectors extracted from the sparse representation into land cover categories. The computer program is further configured to cause the at least one processor to perform land cover classification and change detection in a sparse domain after the image is clustered and output results of the land cover classification and change detection in the sparse domain.

In yet another embodiment, an apparatus includes memory storing computer program instructions and at least one processor configured to execute the stored computer program instructions. The at least one processor, by executing the stored computer program instructions, is configured to form a learned dictionary by computing the dictionary in a frequency domain by using coefficient maps, using an iterated Sherman-Morrison algorithm for a dictionary update, and output a dictionary when stopping tolerances are met. The at least one processor is also configured to compute a sparse representation with respect to the learned dictionary and perform land cover classification and/or change detection in a sparse domain. The at least one processor is further configured to output results of the land cover classification and/or change detection in the sparse domain.

BRIEF DESCRIPTION OF THE DRAWINGS

In order that the advantages of certain embodiments of the invention will be readily understood, a more particular description of the invention briefly described above will be rendered by reference to specific embodiments that are illustrated in the appended drawings. While it should be understood that these drawings depict only typical embodiments of the invention and are not therefore to be considered to be limiting of its scope, the invention will be described and explained with additional specificity and detail through the use of the accompanying drawings, in which.

DETAILED DESCRIPTION OF THE EMBODIMENTS

Figure 1:
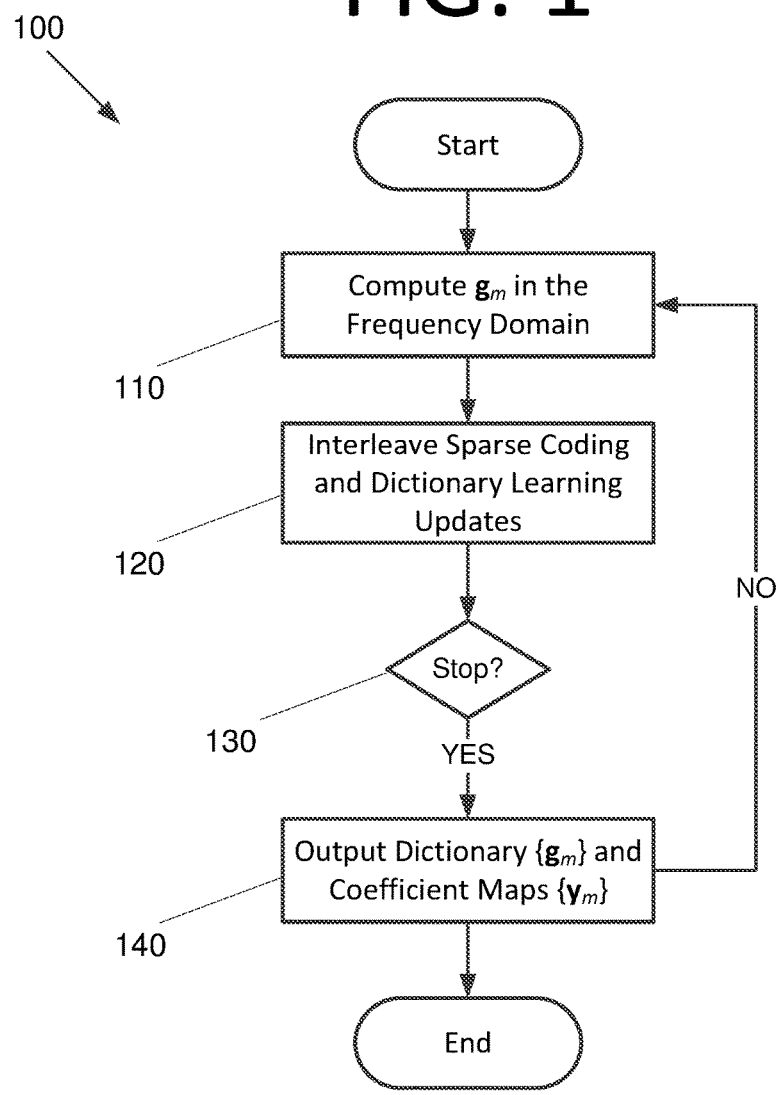
FIG. 1 is a flowchart illustrating a process for fast dictionary learning, according to an embodiment of the present invention.

Some embodiments of the present invention pertain to a classifier that performs unsupervised classification of land cover in multispectral or hyperspectral imagery, such as satellite imagery, using clustering of sparse approximations (CoSA) on convolutional sparse representations in learned dictionaries. "Multispectral" imagery typically includes between 3-12 bands that are represented in pixels. "Hyperspectral" imagery typically consists of far more, narrower bands (usually 10-20 nm). For instance, a hyperspectral image may have hundreds or thousands of bands. However, use of any number and size of bands is contemplated without deviating from the scope of the invention. For multi-band applications, efficient convolutional sparse coding may be applied independently to each band, or joint representation over all bands may be computed as described in B. Wohlberg, "Convolutional sparse representation of color images," Proceedings of the IEEE Southwest Symposium on Image Analysis and Interpretation (SSIAI), Santa Fe, N. Mex. (March 2016).

Convolutional sparse image representations of images over the learned dictionaries may be used to perform unsupervised k-means clustering into land cover categories. This approach may combine spectral and spatial textural characteristics to detect geologic, vegetative, and hydrologic features. Furthermore, man-made features may be detected and monitored, such as progress in construction of a building.

Dictionary learning algorithms extend the idea of dictionaries adapted to data by learning the dictionary elements directly from the data itself, without an underlying analytical data model. An alternating direction method of multipliers (ADMM) algorithm operating in the discrete Fourier transform (DFT) domain has been proposed for dictionary learning for convolutional sparse representations. However, the use of fast Fourier transforms (FFTs) in solving the relevant linear systems has been shown to give substantially better asymptotic performance than a spatial domain method. FFTs are algorithms that compute the DFT and its inverse. The computation time for solving for linear systems in this algorithm, which dominates the computational cost of the algorithm, is $O(M^3N)$. This significant cubic cost renders the algorithm inefficient and impractical for large values of M (i.e., dictionaries with a large number of filters), and is likely the reason that this form of sparse representation has received little attention for image processing applications thus far.

Accordingly, some embodiments employ a more efficient approach, namely, application of a convolutional sparse coding algorithm that is derived within the ADMM framework and solves the main linear system in the frequency domain for a significant computational advantage over conventional algorithms. The most expensive component is solving a very large linear system. A key insight that enables some embodiments to run orders of magnitude faster than conventional approaches is the realization that the matrices occurring in the frequency domain have a special structure that, once recognized, enables a much faster solution. More specifically, the matrices that represent the dictionary in the frequency domain are block matrices where every block is a diagonal, as is described in more detail below.

In practice, some embodiments are 10-100 times faster than conventional convolutional sparse representation approaches. This efficient convolutional sparse coding approach may be applied to obtain sparse representations of learned dictionaries pertaining to image data, such as multispectral or hyperspectral satellite imagery. By incorporating the efficient convolutional sparse coding, better performance can be obtained than via non-convolutional approaches. Due to the improvements in speed presented by some embodiments, new supercomputers (e.g., high performance, multi-parallel cluster systems) may be able to process at least some classes of images in real time. With further advances in computing, real time applications may be possible generally. Parallelization is the key for this improvement, and real time applications are within the scope of the present disclosure.

Using learned dictionaries provides dimensionality reduction, which is desirable in high data rate applications. Sparse image representations over the learned dictionaries may be used to perform unsupervised k-means clustering into land cover classes. CoSA may combine spectral and spatial textural characteristics to detect geologic, vegetative, and hydrologic features in some embodiments. Results suggest that dictionary-based models are a promising approach to practical pattern recognition problems in remote sensing.

Dictionary Learning for Multispectral or Hyperspectral Data

Normally, a domain expert manually derives land cover classification by taking into account both spectral information (e.g., normalized difference indices such as normalized difference vegetative index (NDVI), normalized difference wetness index (NDWI), normalized difference soil index (NDSI), and/or non-homogeneous feature distance (NHFD)), as well as spatial texture (i.e., context given by adjacent pixels). For high resolution satellite imagery, such as WorldView-2™ data, small scale discriminative information is carried by both spectral and spatial texture, i.e., adjacent pixel context. This was often not the case for lower resolution images, such as Landsat™ data (at 30 meters/ pixel), where the spatial context carries significantly less weight compared to the spectral information at small scales (i.e., objects with sizes less than 30 meters). In other words, the spatial context is frequently embedded in a single pixel, leading to challenging pixel unmixing problems.

An efficient convolutional sparse coding algorithm in some embodiments may be used to learn representative land features directly from multi-band satellite image data. These representative features may then be used to approximate the image in a sparse fashion (i.e., with very few decomposition terms). Land cover classification and change detection can then be performed in this sparse domain once the entire image was transformed via the learned dictionary. The dictionaries can be learned in some embodiments from example images and then convolutional sparse coding can be used to generate sparse classification features. Vectors extracted from these sparse representations (e.g., pixel patches including a spatial neighborhood) can be used to perform unsupervised k-means clustering into land cover categories.

Sparse Representations and Dictionary Learning

The dictionary may be learned and sparse representations may be obtained using efficient convolutional sparse coding in some embodiments. Fast algorithms for convolutional sparse coding in some embodiments are derived within the ADMM framework and exploit FFT, as well as fast algorithms for dictionary learning. Such embodiments provide a significant computational advantage as compared with conventional algorithms. This is somewhat similar to the sparse coding component of the dictionary learning algorithm of Bristow et al., but introduces an approach for solving the linear systems that dominate the computational cost of the algorithm in time that is linear in the number of filters, instead of cubic (i.e., $O(M^3N)$) in conventional techniques. See H. Bristow, A. Eriksson, and S. Lucey, "Fast Convolutional Sparse Coding," Proc. IEEE Conf. Comp. Vis. Pat. Recog. (CVPR), pp. 391-398 (June 2013). This significant improvement in efficiency may greatly increase the range of problems that can practically be addressed via convolutional sparse representations. Generally speaking, there are two parts to the process of some embodiments: (1) learn a model describing the data (i.e., "dictionary learning"); and (2) apply the model (i.e., "sparse coding").

Different approaches to sparse coding have been proposed. However, most sparse coding algorithms optimize a functional consisting of a data fidelity term and a sparsity inducing penalty of the form $$\underset{x}{\operatorname{argmin}} \frac{1}{2} \|Dx - s\|_2^2 + \lambda R(x) \quad (1)$$

or constrained forms such as $$\underset{x}{\operatorname{argmin}} R(x) \text{ such that } \|Dx - s\|_2 \le \epsilon \quad (2)$$

or $$\underset{x}{\operatorname{argmin}} \|Dx - s\|_2 \text{ such that } R(x) \le \tau \quad (3)$$

where D is a dictionary matrix, x is the sparse representation, $\lambda$ is a regularization parameter, $\epsilon$ is a reconstruction error threshold, $\tau$ is a sparsity threshold, and $R(\cdot)$ denotes a sparsity inducing function such as the $l^1$ norm or the $l^0$ "norm." While the $l^0$ norm does not conform to all of the requirements of a real norm, it is convenient to write it using norm notation. Regularization parameter $\lambda$ controls the relative importance of the data fidelity term that penalizes a solution that does not match the data and the regularization term that penalizes a solution that is not sparse (i.e., one that has too many non-zero entries). When applied to images, this decomposition is usually applied independently to a set of overlapping image patches covering the image. This approach is convenient, but often necessitates somewhat ad hoc subsequent handling of the overlap between patches. This results in a representation over the whole image that is suboptimal.

The two leading families of sparse coding methods are: (1) a wide variety of convex optimization algorithms (e.g., Alternating Direction Method of Multipliers (ADMM)) for solving Eq. (1) when $R(x)=\|x\|_1$; and (2) a family of greedy algorithms (e.g., matching Pursuit (MP) and Orthogonal Matching Pursuit (OMP)) for providing an approximate solution for Eq. (2) or Eq. (3) when $R(x)=\|x\|_0$.

If the dictionary D is analytically defined and corresponds to a linear operator with a fast transform (e.g., the Discrete Wavelet Transform), a representation for an entire signal or image can readily be computed. More recently, however, it has been realized that improved performance can be obtained by learning the dictionary from a set of training data relevant to a specific problem. This inverse problem is known as "dictionary learning." In this case, computing a sparse representation for an entire signal is not feasible, with the usual approach being to apply the decomposition independently to a set of overlapping blocks covering the signal. This approach is relatively straightforward to implement, but results in a representation that is multi-valued and suboptimal over the signal as a whole, often necessitating somewhat ad hoc handling of the overlap between blocks.

An optimal representation for a given block structure would involve solving a single optimization problem for a block matrix dictionary $\tilde{D}$ with blocks consisting of appropriately shifted versions of the single-block dictionary D. If the block structure is modified such that the step between blocks is a single sample, the representation on the resulting block dictionary $\tilde{D}$ is both optimal for the entire signal and shift-invariant. Furthermore, in this case, the linear representation on the block dictionary $\tilde{D}$ can be expressed as a sum of convolutions of columns $d_m$ of D with a set of spatial coefficient maps corresponding to the subsets of x associated with different shifts of each column of D. In other words, by a straightforward change of indexing of coefficients, the representation $\tilde{D}x \approx s$ is equivalent to $\Sigma_m d_m * x_m \approx s$. This form of sparse representation is referred to here as a "convolutional" sparse representation.

While convolutional forms can be constructed for each of Eq. (1)-(3), the focus herein is on the convolutional form of Eq. (1) with $R(x)=|x|_1$, i.e. the BPDN problem $$\underset{x}{\operatorname{argmin}} \frac{1}{2} \|Dx - s\|_2^2 + \lambda \|x\|_1 \quad (4)$$

Recently, these techniques have been applied to computer vision problems such as face recognition and image classification. In this context, convolutional sparse representations were introduced, replacing Eq. (4) with $$\underset{\{x_m\}}{\operatorname{argmin}} \frac{1}{2} \left\| \sum_m d_m * x_m - s \right\|_2^2 + \lambda \sum_m \|x_m\|_1 \quad (5)$$

where $\{d_m\}$ is a set of M dictionary filters, * denotes convolution, and $\{x_m\}$ is a set of coefficient maps, each of which is the same size as s. Here, s is a full image, and the set of dictionary filters $\{d_m\}$ is usually much smaller. For notational simplicity, s and $x_m$ are considered to be N dimensional vectors, where N is the number of pixels in an image, and the notation $\{x_m\}$ is adopted to denote all M of $x_m$ stacked as a single column vector. The derivations presented here are for a single image with a single color band, but the extension to multiple color bands for both image and filters and simultaneous sparse coding of multiple images is also possible. The extension to color and other multi-band images is mathematically straightforward, at the price of some additional notations.

Given the recent success of ADMM for the standard BPDN problem, it follows that ADMM may be considered for convolutional BPDN. The general outline of the method derived here is similar to the sparse coding component of the Augmented Lagrangian dictionary learning algorithm developed by Bristow et al. At a superficial level, the only difference is that for convolutional BPDN, the ADMM algorithm is derived in the spatial domain with one of the sub-problems being solved in the frequency domain, whereas the sparse coding component of the Augmented Lagrangian dictionary learning algorithm is directly derived using a mixture of spatial and frequency domain variables. A much more important difference and benefit of using the new ADMM algorithm in some embodiments for convolutional BPDN, however, is the use of a far more efficient method for solving the linear system that represents the bulk of the computational cost of the algorithm, which is a new way of solving the main sub-problem. This more efficient method is applied to the analysis of multi-spectral and hyperspectral imagery in some embodiments.

The ADMM iterations for solving the optimization $$\operatorname*{argmin}_{x,y} f(x) + g(y) \text{ such that } Ax + By = c \quad (6)$$

are, in scaled form, $$x^{(j+1)} = \operatorname*{argmin}_{x} f(x) + \frac{\rho}{2}\|Ax + By^{(j)} - c + u^{(j)}\|_2^2 \quad (7)$$

$$y^{(j+1)} = \operatorname*{argmin}_{y} g(y) + \frac{\rho}{2}\|Ax^{(j+1)} + By - c + u^{(j)}\|_2^2 \quad (8)$$

$$u^{(j+1)} = u^{(j)} + Ax^{(j+1)} + By^{(j+1)} - c \quad (9)$$

It is possible to rewrite Eq. (5) above in a form suitable for ADMM by introducing auxiliary variables $\{y_m\}$. The variables $\{y_m\}$, referred to in the plural since there is a set thereof indexed by m, can be thought of as copies of the main $\{y_m\}$ variables. The constraint $\{x_m\}-\{y_m\}=0$ ensures that the problem with these "copies" is equivalent to the original problem. However, the introduction of these copies makes it possible to try to solve the problem by an alternating minimization approach, holding $\{y_m\}$ constant and minimizing $\{x_m\}$, followed by minimizing $\{y_m\}$, then returning to $\{x_m\}$, and so on. In some cases, such as here, solving these two sub-problems turns out to be easier than solving the original problem. This yields $$\operatorname*{argmin}_{\{x_m\},\{y_m\}} \frac{1}{2}\left\|\sum_m d_m * x_m - s\right\|_2^2 + \lambda \sum_m \|y_m\|_1 \text{ such that } x_m - y_m = 0 \; \forall \; m \quad (10)$$

for which the corresponding ADMM iterations with dual variables $\{y_m\}$ are $$\{x_m\}^{(j+1)} = \operatorname*{argmin}_{\{x_m\}} \frac{1}{2}\left\|\sum_m d_m * x_m - s\right\|_2^2 + \frac{\rho}{2}\sum_m \|x_m - y_m^{(j)} + u_m^{(j)}\|_2^2 \quad (11)$$

$$\{y_m\}^{(j+1)} = \operatorname*{argmin}_{\{y_m\}} \lambda \sum_M \|y_m\|_1 + \frac{\rho}{2}\sum_m \|x_m^{(j+1)} - y_m + u_m^{(j)}\|_2^2 \quad (12)$$

$$u_m^{(j+1)} = u_m^{(j)} + x_m^{(j+1)} - y_m^{(j+1)} \quad (13)$$

The set $\{u_m\}$ are Lagrange multipliers in the ADMM approach. This is a standard formulation that is known to those of ordinary skill in the art of optimization. $\rho$ is the penalty parameter that plays a similar role to that discussed above. $\rho$ controls the "strength" of the term that enforces the constraint that $\{x_m\}=\{Y_m\}$, which is necessary for the split problem to be equivalent to the original one. $\rho$ is an important algorithm parameter that ends up controlling how fast the iterative algorithm converges.

The sub-problem of Eq. (12) can be solved via shrinkage/soft thresholding as $$y_m^{(j+1)} = S_{\lambda/\rho}(x_m^{(j+1)} + u_m^{(j)}) \quad (14)$$

where $$S_\gamma(u) = \operatorname{sign}(u) \odot \max(0, |u| - \gamma) \quad (15)$$

with sign(•) and |•| of a vector considered to be applied element-wise, and $\odot$ denoting element-wise multiplication. The computational cost of this sub-problem is O(MN). The only computationally expensive step is solving Eq. (11), which is of the form $$\operatorname*{argmin}_{\{x_m\}} \frac{1}{2}\left\|\sum_m d_m * x_m - s\right\|_2^2 + \frac{\rho}{2}\sum_m \|x_m - z_m\|_2^2 \quad (16)$$

It is possible to attempt to exploit the FFT for efficient implementation of the convolution via the DFT convolution theorem. This involves some increase in memory requirements since $d_m$ is zero-padded to the size of $x_m$ before application of the FFT.

Linear operators $D_m$ are defined such that $D_m x_m = d_m * x_m$, and the variables $D_m$, $x_m$, s, and $z_m$ are denoted in the DFT domain by $\hat{D}_m$, $\hat{x}_m$, $\hat{s}_m$, and $\hat{z}_m$, respectively. It can be shown via the DFT convolution theorem that Eq. (16) is equivalent to $$\operatorname*{argmin}_{\{\hat{x}_m\}} \frac{1}{2}\left\|\sum_m \hat{D}_m \hat{x}_m - \hat{s}\right\|_2^2 + \frac{\rho}{2}\sum_m \|\hat{x}_m - \hat{z}_m\|_2^2 \quad (17)$$

with the $\{x_m\}$ minimizing in Eq. (16) being given by the inverse DFT of the $\{\hat{x}_m\}$ minimizing in Eq. (17). By defining $$\hat{D} = (\hat{D}_0 \quad \hat{D}_1 \quad \ldots), \hat{x} = \begin{pmatrix} \hat{x}_0 \\ \hat{x}_1 \\ \vdots \end{pmatrix}, \hat{z} = \begin{pmatrix} \hat{z}_0 \\ \hat{z}_1 \\ \vdots \end{pmatrix} \quad (18)$$

this problem can be expressed as $$\underset{\{\hat{x}\}}{\operatorname{argmin}} \frac{1}{2}\|\hat{D}\hat{x} - \hat{s}\|_2^2 + \frac{\rho}{2}\|\hat{x} - \hat{z}\|_2^2 \quad (19)$$

the solution being given by the linear system $$(\hat{D}^H\hat{D} + \rho I)\hat{x} = \hat{D}^H\hat{s} + \rho\hat{z} \quad (20)$$

Matrix $\hat{D}$ has a block structure consisting of M concatenated N×N diagonal matrices, where M is the number of filters and N is the number of samples in s. $\hat{D}^H\hat{D}$ is an MN×MN matrix, but due to the diagonal block (not block diagonal) structure of $\hat{D}$, a row of $\hat{D}^H$ with its non-zero element at column n will only have a non-zero product with a column of $\hat{D}$ with its non-zero element at row n. As a result, there is no interaction between elements of $\hat{D}$ corresponding to different frequencies, so that one need only solve N independent M×M linear systems to solve Eq. (20). The cost of the FFTs and solving these linear systems dominate the computational cost of the algorithm.

The previous approach of Bristow et al. did not specify how to solve these linear systems. However, since the computational cost of solving the linear systems is rated as $O(M^3N)$, it can be concluded that a direct method, such as Gaussian elimination (GE), is applied. This can be effective when it is possible to precompute and store a lower upper (LU), which is a standard decomposition in linear algebra, or a Cholesky decomposition (or similar decomposition) of the system matrix. In the present case, such an approach is not practical, and generally impossible unless M is very small, due to the $O(M^2N)$ memory requirement for storage of these decompositions. Nevertheless, this remains a reasonable approach for small values of M, with the only apparent alternative being an iterative method such as conjugate gradient (CG).

However, a careful analysis of the unique structure of this problem reveals that there is an alternative and vastly more effective solution, which some embodiments employ. More specifically, there is a special structure to the matrices, which are block matrixes where every block is a diagonal. The $m^{th}$ block of the right hand side of Eq. (20) may be defined as $$\hat{r}_m = \hat{D}_m^H\hat{s} + \rho\hat{z}_m \quad (21)$$

so that $$\begin{pmatrix} \hat{r}_0 \\ \hat{r}_1 \\ \vdots \end{pmatrix} = \hat{D}^H\hat{s} + \rho\hat{z} \quad (22)$$

Denoting the $n^{th}$ element of a vector x by x(n) to avoid confusion between indexing of the vectors themselves and selection of elements of these vectors, define $$v_n = \begin{pmatrix} \hat{x}_0(n) \\ \hat{x}_1(n) \\ \vdots \end{pmatrix} \quad b_n = \begin{pmatrix} \hat{r}_0(n) \\ \hat{r}_1(n) \\ \vdots \end{pmatrix} \quad (23)$$

and define $a_n$ as the column vector containing all of the non-zero entities from column n of $\hat{D}^H$, that is $$\hat{D} = \begin{pmatrix} \hat{d}_{0,0} & 0 & 0 & \cdots & \hat{d}_{1,0} & 0 & 0 & \cdots \\ 0 & \hat{d}_{0,1} & 0 & \cdots & 0 & \hat{d}_{1,1} & 0 & \cdots \\ 0 & 0 & \hat{d}_{0,2} & \cdots & 0 & 0 & \hat{d}_{1,2} & \cdots \\ \vdots & \vdots & \vdots & \ddots & \vdots & \vdots & \vdots & \ddots \end{pmatrix} \quad (24)$$

then $$a_n = \begin{pmatrix} \hat{d}_{0,n}^* \\ \hat{d}_{1,n}^* \\ \vdots \end{pmatrix} \quad (25)$$

where * denotes complex conjugation. The linear system to solve corresponding to an element n of $\{x_m\}$ is $$(a_n a_n^H + \rho I)v_n = b_n \quad (26)$$

The independent systems have a left hand side consisting of a diagonal matrix plus a rank-one component, which can be solved very efficiently by the Sherman-Morrison formula $$(A + uv^H)^{-1} = A^{-1} - \frac{A^{-1}uv^H A^{-1}}{1 + v^H A^{-1} u} \quad (27)$$

which yields $$(\rho I + aa^H)^{-1} = \rho^{-1}\left(I - \frac{aa^H}{\rho + a^H a}\right) \quad (28)$$

so that the solution to Eq. (26) is $$v_n = \rho^{-1}\left(b_n - \frac{a_n^H b_n}{\rho + a_n^H a_n} a_n\right) \quad (29)$$

The only vector operations are scalar multiplication, subtraction, and inner products, rendering this method $O(M)$ instead of $O(M^3)$ as in Eq. (20). The cost of solving such a system at all N frequency indices is $O(MN)$, and the cost of the FFTs is $O(MN \log N)$. The cost of the FFTs dominates the computational complexity, whereas in Eq. (20), the cost of the solutions of the linear systems in the DFT domain dominates the cost of the FFTs.

This approach can be implemented in an interpreted language such as Matlab™ in a form that avoids explicit iteration (i.e., loops) over the N frequency indices by passing data for all N frequency indices as a single array to the relevant linear-algebraic routines, commonly referred to as "vectorization" in Matlab™ terminology. Some additional computation time improvement is possible, at the cost of additional memory requirements, by precomputing components of Eq. (28), e.g., $a_n^H/(\rho + a_n^H a_n)$.

An ADMM algorithm for Convolutional BPDN according to some embodiments is summarized below. Some typical values for the penalty auto-update parameters in some embodiments are $J_p = 1$, $\mu = 10$, and $\tau = 2$. A subscript indexed variable written without the superscript denotes the entire set of vectors concatenated as a single vector, e.g., x denotes the vector constructed by concatenating all vectors $x_m$.

```
Input: image s (N pixels), filter dictionary {d_m} (M filters), regularization
  parameter λ, initial penalty parameter ρ_0, penalty auto-update parameters
  J_p, μ, τ, relaxation parameter α, maximum iterations J_max, and absolute
  and relative stopping tolerances ∈_abs, ∈_rel
Precompute: ŝ = FFT(s), D̂_m = FFT(d_m) ∀m
Initialize: y_m = y_m^prev = u_m = 0 ∀m, ρ = ρ_0, j = 1
repeat
    ẑ_m = FFT(y_m − u_m) ∀m
    compute x̂_m ∀m as in Eq. (21)-(29)
    x_m = IFFT(x̂_m)
    x_relax,m = αx_m + (1 − α)y_m ∀m
    y_m = S_λ/ρ(x_relax,m + u_m) ∀m
    u_m = u_m + x_relax,m − y_m ∀m
    r = ||x − y||_2
    s = ρ||y^prev − y||_2
    ∈_pri = ∈_abs √MN + ∈_rel max{||x||_2, ||y||_2}
    ∈_dua = ∈_abs √MN + ∈_rel ρ||u||_2
    y_m^prev = y_m ∀m
    if j ≠ 1 and j mod J_p = 0 then
        if r > μs then
            ρ = τρ
            u_m = u_m/τ ∀m
        else if s > μr then
            ρ = ρ/τ
            u_m = τu_m ∀m
        end
    end
    j = j + 1
until j > J_max or (r ≤ ∈_pri and s ≤ ∈_dua)
Output: coefficient maps y_m
```

The computational cost of the algorithm components is $O(MN \log N)$ for the FFTs, order $O(MN)$ for the proposed linear solver, and $O(MN)$ for both the shrinkage and dual variable update. Thus, the entire cost of the algorithm is $O(MN \log N)$, dominated by the cost of the FFTs.

In contrast, the cost of the algorithm of Bristow et al. is $O(M^3 N)$, which tends to be computationally expensive for a practical sized dictionary. There is also a $O(MN \log N)$ cost for FFTs under conventional approaches, but it is dominated by the $O(M^3 N)$ cost of the linear solver, and the cost of the original spatial-domain algorithm in conventional approaches is $O(M^2 N^2 L)$, where L is the dimensionality of the filters.

The extension of Eq. (5) to learning a dictionary from training data involves replacing the minimization with respect to $x_m$ with minimization with respect to both $x_m$ and $d_m$. The optimization is performed via alternating minimization between the two variables, the most common approach consisting of a sparse coding step followed by a dictionary update. The commutativity of convolution suggests that the DFT domain solution discussed above can be directly applied in minimizing with respect to $d_m$ instead of $x_m$. However, this is not possible since $d_m$ is of constrained size and must be zero-padded to the size of $x_m$ prior to a DFT domain implementation of the convolution.

If the size constraint is implemented in an ADMM framework, however, the problem is decomposed into a computationally cheap sub-problem corresponding to a projection onto a constraint set and another sub-problem that can be efficiently solved by extending the approach discussed above. This iterative algorithm for the dictionary update can alternate with a sparse coding stage to form a more traditional dictionary learning method, or the sub-problems of the sparse coding and dictionary update algorithms can be combined into a single ADMM algorithm.

In contrast to standard sparse representations, it is possible to define the convolutional dictionary learning problem in the Single Measurement Vector (SMV) case, but for full generality, it should be construed in the Multiple Measurement Vector (MMV) context. Including the usual constraint on the norm of dictionary elements, the problem can be expressed as $$\operatorname*{argmin}_{\{d_m\},\{x_{k,m}\}} \frac{1}{2} \sum_k \left\| \sum_m d_m * x_{k,m} - s_k \right\|_2^2 + \lambda \sum_k \sum_m \|x_{k,m}\|_1 \quad (30)$$

such that $\|d_m\|_2 = 1 \forall m$ (31)

The standard approach is to solve via alternating minimization with respect to $\{x_{k,m}\}$ and $\{d_m\}$. The minimization with respect to $\{x_{k,m}\}$ involves solving the MMV extension of Convolutional BPDN, which is trivial since the problems for each k are decoupled from one another, but $\{d_m\}$ is more challenging since the problems for different k are coupled.

Ignoring the constraint on the norm of $d_m$, which is usually applied as a postprocessing normalization step after the update, the minimization with respect to $\{d_m\}$ can be expressed as $$\operatorname*{argmin}_{\{d_m\}} \frac{1}{2} \sum_k \left\| \sum_m d_m * x_{k,m} - s_k \right\|_2^2 \quad (32)$$

which is a convolutional form of the Method of Optimal Directions (MOD). When computing the convolutions $d_m * x_{k,m}$ in the DFT domain, there is an implicit zero-padding of the filters $d_m$ to the size of the coefficient maps $x_{k,m}$. This can be overlooked when minimizing with respect to the coefficient maps, but must be explicitly represented when minimizing with respect to the filters to ensure that the filters resulting from the optimization have an appropriately constrained support in the spatial domain. Defining zero-padding operator P, Eq. (32) can be expressed in the DFT domain as $$\operatorname*{argmin}_{\{d_m\}} \frac{1}{2} \sum_k \left\| \sum_m (\overline{Pd_m}) \odot \hat{x}_{k,m} - \hat{s}_k \right\|_2^2 \quad (33)$$

Unfortunately, the spatial-domain operator P does not have a compact representation in the DFT domain, making an efficient direct DFT domain solution impossible. A variable splitting approach, however, makes it possible to solve this problem, including dictionary norm constraints, via an ADMM algorithm.

The desired filters can be obtained as $P^T d_m$ after solving the constrained problem $$\operatorname*{argmin}_{\{d_m\}} \frac{1}{2} \sum_k \left\| \sum_m x_{k,m} * d_m - s_k \right\|_2^2 \text{ such that } d_m \in C_P \forall m \quad (34)$$

where the $d_m$ have the same spatial support as the $x_{k,m}$, and $$C_P = \{x \in \mathbb{R}^N : (I - PP^T)x = 0\} \quad (35)$$

Since a constrained problem requiring an iterative solution is being setup, however, it is reasonable to also include the normalization $\|d_m\|_2 = 1$ or $\|d_m\|_2 \leq 1$ of the dictionary elements that is often, and suboptimally, performed as a postprocessing step after the dictionary update. Including the normalization requirement $\|d_m\|_2=1$, the constraint set becomes $$C_{PN}=\{x\in \mathbb{R}^N:(I-PP^T)x=0, \|x\|_2=1\} \quad (36)$$

Employing the indicator function $1_{C_{PN}}$ of the constraint set $C_{PN}$, the constrained problem can be written in unconstrained form $$\underset{\{d_m\}}{\arg\min} \frac{1}{2}\sum_k \left\|\sum_m x_{k,m}*d_m - s_k\right\|_2^2 + \sum_m l_{C_{PN}}(d_m) \quad (37)$$

and rewriting with an auxiliary variable in a form suitable for ADMM gives $$\underset{\{d_m\}}{\arg\min} \frac{1}{2}\sum_k \left\|\sum_m x_{k,m}*d_m - s_k\right\|_2^2 + \sum_m l_{C_{PN}}(g_m)$$

such that $d_m - g_m = 0 \forall m$ (38)

The indicator function of a set S is defined as $$l_S = \begin{cases} 0 & \text{if } X \in S \\ \infty & \text{if } X \notin S \end{cases} \quad (39)$$

This problem can be solved via an ADMM algorithm $$\{d_m\}^{(j+1)} = \quad (40)$$

$$\underset{\{d_m\}}{\arg\min} \frac{1}{2}\sum_k \left\|\sum_m x_{k,m}*d_m - s_k\right\|_2^2 + \frac{\rho}{2}\sum_m \|d_m - g_m^{(j)} - h_m^{(j)}\|_2^2$$

$$\{g_m\}^{(j+1)} = \underset{\{g_m\}}{\arg\min} \sum_m l_{C_{PN}}(g_m) + \frac{\rho}{2}\sum_m \|d_m^{(j+1)} - g_m - h_m^{(j)}\|_2^2 \quad (41)$$

$$h_m^{(j+1)} = h_m^{(j)} + d_m^{(j+1)} - g_m^{(j+1)} \quad (42)$$

The $\{g_m\}$ update is of the form $$\underset{x}{\arg\min} \frac{1}{2}\|x-y\|_2^2 + l_{C_{PN}}(x) = prox_{l_{C_{PN}}}(y) \quad (43)$$

It is clear from the geometry of the problem that $$prox_{l_{C_{PN}}}(y) = \frac{PP^T y}{\|PP^T y\|_2} \quad (44)$$

or, if the normalization $\|d_m\|_2 \le 1$ is desired instead, $$prox_{l_{C_{PN}}}(y) = \begin{cases} PP^T y & \text{if } \|PP^T y\|_2 \le 1 \\ \dfrac{PP^T y}{\|PP^T y\|_2} & \text{if } \|PP^T y\|_2 > 1 \end{cases} \quad (45)$$

The problem for the $\{d_m\}$ update is of the form $$\underset{\{d_m\}}{\arg\min} \frac{1}{2}\sum_k \left\|\sum_m x_{k,m}*d_m - s_k\right\|_2^2 + \frac{\sigma}{2}\sum_m \|d_m - z_m\|_2^2 \quad (46)$$

In the DFT domain, where $\hat{X}_{k,m}=\text{diag}(\hat{x}_{k,m})$, this becomes $$\underset{\{d_m\}}{\arg\min} \frac{1}{2}\sum_k \left\|\sum_m \hat{X}_{k,m}\hat{d}_m - \hat{s}_k\right\|_2^2 + \frac{\sigma}{2}\sum_m \|\hat{d}_m - \hat{z}_m\|_2^2 \quad (47)$$

Defining $$\hat{X}_k = \left(\hat{X}_{k,0} \ \hat{X}_{k,1} \ \ldots \ \right) \ \hat{d} = \begin{pmatrix} \hat{d}_0 \\ \hat{d}_1 \\ \vdots \end{pmatrix} \ \hat{z} = \begin{pmatrix} \hat{z}_0 \\ \hat{z}_1 \\ \vdots \end{pmatrix} \quad (48)$$

this problem can be expressed as $$\underset{\hat{d}}{\arg\min} \frac{1}{2}\sum_k \|\hat{X}_k \hat{d} - \hat{s}_k\|_2^2 + \frac{\sigma}{2}\|\hat{d} - \hat{z}\|_2^2 \quad (49)$$

with the solution $$\left(\sum_k \hat{X}_k^H \hat{X}_k + \sigma I\right)\hat{d} = \sum_k \hat{X}_k^H \hat{s}_k + \sigma \hat{z} \quad (50)$$

This linear system can be solved by iterated application of the Sherman-Morrison formula. The separable components of Eq. (50) are of the form $$(J+a_0 a_0^H + a_1 a_1^H + \ldots + a_K a_K^H)x = b \quad (51)$$

Define $A_0=J$ and $A_{k+1}=A_k + a_k a_k^H$. Application of the Sherman-Morrison formula yields $$A_{k+1}^{-1} = (A_k + a_k a_k^H)^{-1} = A_k^{-1} - \frac{A_k^{-1} a_k a_k^H A_k^{-1}}{1 + a_k^H A_k^{-1} a_k} \quad (52)$$

Now define $\alpha_{l,k}=A_l^{-1} a_k$ and $\beta_k=A_k^{-1} b$ such that $\alpha_{0,k}=J^{-1}a_k$ and $\beta_0=J^{-1}b$, so that $$\beta_{k+1} = A_k^{-1} b \quad (53)$$

$$= A_k^{-1} b - \frac{A_k^{-1} a_k a_k^H A_k^{-1} b}{1 + a_k^H A_k^{-1} a_k} \quad (54)$$

$$= \beta_k - \frac{\alpha_{k,k} a_k^H \beta_k}{1 + a_k^H \alpha_{k,k}} \quad (55)$$

-continued and $$\alpha_{l+1,k} = A_{l+1}^{-1} a_k \tag{56}$$

$$= A_l^{-1} a_k - \frac{A_l^{-1} a_l a_l^H A_l^{-1} a_k}{1 + a_l^H A_l^{-1} a_k} \tag{57}$$

$$= \alpha_{l,k} - \frac{\alpha_{l,l} a_l^H \alpha_{l,k}}{1 + a_l^H \alpha_{l,l}} \tag{58}$$

An iterative algorithm to compute the solution for the system of Eq. (51), given by $\beta_K$, may be derived from these equations. An algorithm for solving Eq. (51) when $J=\rho I$ is presented below.

```
Input: vectors {a_k}, parameter ρ
Initialize: α = ρ⁻¹a₀, β = ρ⁻¹b
for k ∈ {1 ... K} do γ_{k-1} = α / (1 + a_{k-1}^H α)

β = β - γ_{k-1}a_{k-1}^H β
    if k ≤ K - 1 then
        α = ρ⁻¹a_k
        for l ∈ {1 ... K} do
            α = α - γ_{l-1}a_{l-1}^H α
        end
    end
end
Output: linear equation solution β
```

Alternatively, other equivalent solutions for iterative application of the Sherman-Morrison formula may be applied, such as that proposed by N. Egidi and P. Maponi in "A Sherman-Morrison Approach to the Solution of Linear Systems," Journal of Computational and Applied Mathematics, vol. 189, no. 1-2, pp. 703-718 (May 2006).

Given iterative algorithms for the $x_{k,m}$ and $d_m$ updates (i.e., the ADMM algorithms for Convolutional BPDN and Constrained MOD respectively), the immediate question is how these should be combined into a full dictionary learning algorithm. The standard approach is to alternate between sparse coding and dictionary update, solving the sparse coding problem with reasonable accuracy before moving on to the dictionary update. Since each sub-problem is an iterative algorithm, this would entail performing multiple iterations of each sub-problem before switching to the other. A reasonable strategy is to maintain the auxiliary variables for each sub-problem across the top-level iterations since performing a cold start at each switch of sub-problems would entail substantially reduced efficiency. The necessity of retaining these variables, in turn, suggests interleaving the ADMM iterations for each sub-problem into a single set of iterations, rather than combining the $x_{k,m}$ and $d_m$ updates in a way that treats each as a single functional unit. This general strategy of interleaving the algorithms for sparse code and dictionary updates has previously been proposed, but with substantially different algorithms for each update. A single iteration of the resulting algorithm consists of updates Eq. (11), (12), (13), (40), (41), and (42) in sequence.

The most obvious way of combining these updates is to transfer the primary variables across to the other update steps, i.e., $d_m$ represent the dictionary in the sparse coding steps and $x_{k,m}$ represent the sparse code in the dictionary update steps. Such a combination turns out to be quite unstable in practice, with convergence being very sensitive to suitable choices of the $\rho$ and $\sigma$ parameters for each update. A far more stable algorithm is obtained if the updates are interleaved on their auxiliary variables, i.e., $g_m$ represent the dictionary in the sparse coding steps, and $y_{k,m}$ represent the sparse code in the dictionary update steps. It is worth noting that such a combination is not derivable from single Augmented Lagrangian functional. Additional differences in derivation and algorithm from Bristow et al. include that the Augmented Lagrangian is constructed using a mixture of spatial and frequency domain variables, while the derivation presented here presents the problem in the spatial domain, switching into the frequency domain where appropriate for efficient solution of relevant sub-problems. Also, the ADMM algorithm from Bristow et al. is derived in unscaled rather than scaled form. These choices appear to lead to a slightly more complicated path to deriving solutions to at least one of the sub-problems.

The entire algorithm for Convolutional BPDN in some embodiments, including dictionary learning, is summarized below. A subscript indexed variable written without the subscript denotes the entire set of vectors concatenated as a single vector, e.g., x denotes the vector constructed by concatenating all vectors $x_{k,m}$.

```
Input: images s_k (K images of N pixels each), initial dictionary d_m⁰
(M filters), regularization parameter λ, initial penalty parameters σ₀, ρ₀,
penalty auto-update parameters J_{x,p}, μ_x, τ_x, J_{d,p}, μ_d,
τ_d, relaxation parameters α_x, α_d, maximum iterations J_{max}, and
absolute and relative stopping tolerances ∈_{abs}, ∈_{rel}
Precompute: ŝ_k = FFT(s_k) ∀k
Initialize:  y_{k,m} = y_{k,m}^{prev} = u_{k,m} = 0 ∀k, m  h_m = 0  g_m^{prev} = d_m⁰ ∀m, ρ =
             ρ₀, σ = σ₀, j = 1
repeat
    ĝ_m = FFT(g_m) ∀m
    ẑ_{k,m} = FFT(y_{k,m} - u_{k,m}) ∀k, m
    Compute x̂_{k,m} ∀k, m as in Eq. (16)-(29) using ĝ_{k,m} as the dictionary
    x_{k,m} = IFFT(x̂_{k,m})
    x_{relax,k,m} = α_x x_{k,m} + (1 - α_x)y_{k,m} ∀k, m
    y_{k,m} = S_{λ/ρ}(x_{relax,k,m} + u_{k,m}) ∀k, m
    u_{k,m} = u_{k,m} + x_{relax,k,m} - y_{k,m} ∀k, m
    ŷ_{k,m} = FFT(y_{k,m}) ∀k, m
    ẑ_m = FFT(g_m - h_m) ∀m
    Compute d_m ∀m as in Eq. (46)-(58) using ŷ_{k,m} as the coefficient maps
    d_m = IFFT(d_m)
    d_{relax,m} = α_d d_m + (1 - α_d)g_m ∀m
    g_m = prox_{ι_{C_{PN}}}(d_{relax,m} + h_m) ∀m
    h_m = h_m + d_{relax,m} - x_m ∀m
    r_x = ||x - y||_2
    s_x = ρ||y^{prev} - y||_2
    r_d = ||d - g||_2
    s_d = σ||g^{prev} - g||_2
    ∈_{x,pri} = ∈_{abs}√KMN + ∈_{rel} max{||x||_2, ||y||_2}
    ∈_{x,dua} = ∈_{abs}√KMN + ∈_{rel} ρ||u||_2
    ∈_{d,pri} = ∈_{abs}√MN + ∈_{rel} max{||d||_2, ||g||_2}
    ∈_{d,dua} = ∈_{abs}√MN + ∈_{rel} σ||h||_2
    y_m^{prev} = y_m ∀m
    g_m^{prev} = g_m ∀m
    if j ≠ 1 and j mod J_{x,p} = 0 then
        if r_x > μ_x s_x then
            ρ = τ_x ρ
            u_m = u_m/τ_x ∀m
        else if s_x > μ_x r_x then
            ρ = ρ/τ_x
            u_m = τ_x u_m ∀m
        end
    end
    if j ≠ 1 and j mod J_{d,p} = 0 then
        if r_d > μ_d s_d then
            σ = τ_d σ
            h_m = h_m/τ_d ∀m
```

-continued

```
    else if s_d > μ_d r_d then
        σ = σ/τ_d
        h_m = τ_d h_m  ∀m
    end
  end
until j > J_max or (r_x ≤∈_{x,pri} and s_x ≤∈_{x,dua} and r_d ≤∈_{d,pri} and s_d ≤ ∈_{d,dua})
Output: Dictionary {g_m}, coefficient maps {y_m}
```

Multi-Scale Dictionaries

Prior methods all have structural constraints that are either imposed by the properties of the transform domain within which the sparse representation is computed or from the quadtree spatial structure imposed on the dictionary. This ultimately results from the difficulty of applying a multi-scale dictionary in a natural way within a patch-based framework. In the convolutional sparse representation framework, in contrast, there is no reason why the dictionary filters should be of the same size, and multi-scale dictionaries can be defined in a natural way, without any structural constraints on their form. Learning of such dictionaries is no more difficult than learning a single-scale dictionary, simply by replacing P with $P_m$ in Eq. (33), (35), (36), (44), and (45). Nonetheless, the learning and use of multi-scale convolutional dictionaries has not previously been considered in imaging applications, and has only received very limited attention in a signal processing context. For instance, the possibility of using filters of different lengths has been identified, but not discussed in any detail.

Multi-Band, Multiresolution Learned Dictionaries

A large set of images may be used to learn dictionaries via efficient convolutional sparse coding. In some embodiments, these dictionaries may exploit the multiscale structure supported by convolutional sparse representations.

CoSA: Clustering of Sparse Approximations

The CoSA algorithm seeks to automatically identify land cover categories in an unsupervised fashion. In order to accomplish this, a k-means clustering algorithm may be used on feature vectors (e.g., patches including a spatial neighborhood) extracted from sparse approximations of multispectral or hyperspectral images found using dictionaries learned from efficient convolutional sparse coding. Some embodiments include data transformations that would enable more class separability, e.g., band difference indices. Also, the inclusion of LiDAR data and LiDAR derived indices in the dictionary learning process, for example, is possible in some embodiments. This may provide joint dictionary feature learning for wide area unsupervised classification and/or change detection and monitoring.

A large number of clustering scenarios should be considered in some embodiments. An important step is determining the number of clusters necessary for good classification from a domain expert point of view. Trained cluster centers may be used to generate land cover labels at the same spatial pixel resolution of an original image, such as a satellite image. Specifically, for every pixel in the image, a clustering classification label may be given based on its surrounding context (i.e., a patch centered on the respective pixel in the convolutional sparse representation). Each central pixel in a patch may therefore be assigned a classification level based on both its surrounding context and its spectral properties. One way to assess the quality of the full image land cover labels generated by CoSA is to quantify the resulting Euclidian intracluster distances when the entire image has been clustered.

In an ideal case, performance in classification of land cover would be best optimized and/or evaluated based on domain expert verified pixel-level ground truth. The amount of such training and validation data would have to be relatively large considering the dimensionality of the satellite imagery, the complexity of the terrain, and the parameter space of the CoSA algorithm, e.g., of the order of thousands up to tens of thousands of pixels at the equivalent World-View-2™ resolution, for example. This may present an opportunity for field ecologists to generate such verified ground truth data. Meanwhile, in the absence of pixel-level ground truth, one way to assess the quality of the full image land cover labels generated by CoSA is to quantify their resulting intracluster distances.

The learned dictionary algorithm used in CoSA that employs efficient convolutional sparse coding in some embodiments is summarized below. Given a training set of images, a dictionary is initialized by seeding the dictionary elements with randomly drawn training image patches. The dictionary may also be initialized in some embodiments with random unit-norm vectors or a sparsifying transform of image patches. The dictionary may be learned based on the efficient convolutional sparse coding process discussed above.

Separability of Classes Metric

A quantitative and meaningful metric for clustering can be derived based on intrinsic data properties, specifically by assessing how individual clusters capture normalized difference index information. For each pixel in a given cluster, the values corresponding to its four normalized difference band indices may be extracted. Effectively, each cluster resulting from CoSA can now be represented in this four-dimensional space defined by (NDVI, NDWI, NDSI, NHFD), for example. The three dominant indices, NDVI, NDWI, and NHFD, may be chosen to visualize the clusters. This is a novel metric, or more specifically, a novel metric domain for Euclidian distance, which may provide a more intuitive approach, to evaluating class separability using a more natural data interpretation compared to actual pixel intensity.

Change Detection Using CoSA

Since CoSA labels may be pixel-level and georeferenced, they could be used to track pixel-level change at the resolution of the original satellite imagery for any small area of interest (e.g., map vegetation inside a particular polygon). One approach is to consider the changes in the sizes of the clusters, that is, the number of pixels that change labels over time. The relative change may be calculated by:

$$\text{relative\_change} = (\text{cluster\_size}_{t_2} - \text{cluster\_size}_{t_1})/\text{cluster\_size}_{t_1} \quad (59)$$

where time $t_2$ is subsequent to time $t_1$.

The relative percent changes in label count may be useful to estimate the rate at which changes are occurring, for example. The scale of changes is also of interest, i.e., the size of the impacted areas with respect to a nominal 1.82 meter resolution:

$$\text{area\_change} = \left(\text{cluster}_{size_{t_2}} - \text{cluster}_{size_{t_1}}\right) \times \text{pixel\_area} \quad (60)$$

FIG. 1 is a flowchart 100 illustrating a process for fast dictionary learning, according to an embodiment of the present invention. Per the above, since the constrained problem in this case requires an iterative solution, the normalization $\|d_m\|_2 = 1$ or $\|d_m\|_2 \leq 1$ of the dictionary elements is included, rather than performing the normalization as a postprocessing step after the dictionary update.

A novel aspect of the dictionary learning of some embodiments is in using the iterated Sherman-Morrison algorithm for the dictionary update. For a relatively small number of training images K, this is considerably faster than previous methods for solving this update. For instance, if K=1, this approach may be 10 times faster than other methods, but this also depends on other factors, such as the size of the dictionary. As K becomes larger, the performance improvement decreases, and is eventually overtaken by standard methods of solving a linear system, such as Conjugate Gradient and Gaussian Elimination. More specifically, as K increases, the advantage is slowly reduced, with very limited advantage remaining by K=32. If the dictionary is smaller (i.e., M is smaller), this point will be reached at a smaller K, and conversely, if M is larger, at a larger K.

Another novel aspect of some embodiments is in the interleaving between sparse coding and dictionary updates in the dictionary learning algorithm above. Bristow et al. used $d_m$ as the dictionary in the sparse coding stage and $x_{k,m}$ as the sparse representation in the dictionary update stage. Such a combination turns out to be quite unstable in practice. However, the algorithm is much more stable if g and y, respectively, are used for these two stages.

The process begins with computing $\hat{g}_m$ $\forall m$ as in Eq. (46)-(50) using $\hat{y}_{k,m}$ as the coefficient maps and using the iterated Sherman-Morrison algorithm for the dictionary update at 110. Updates on sparse coding and dictionary learning are interleaved at 120 such that $g_m$ represent the dictionary in the sparse coding steps, and $y_{k,m}$ represent the sparse code in the dictionary update steps. If stopping tolerances are met at 130, the process proceeds to outputting the dictionary $\{g_m\}$ and coefficient maps $\{y_m\}$ at 140. Otherwise, the process returns to 110.

Figure 2:
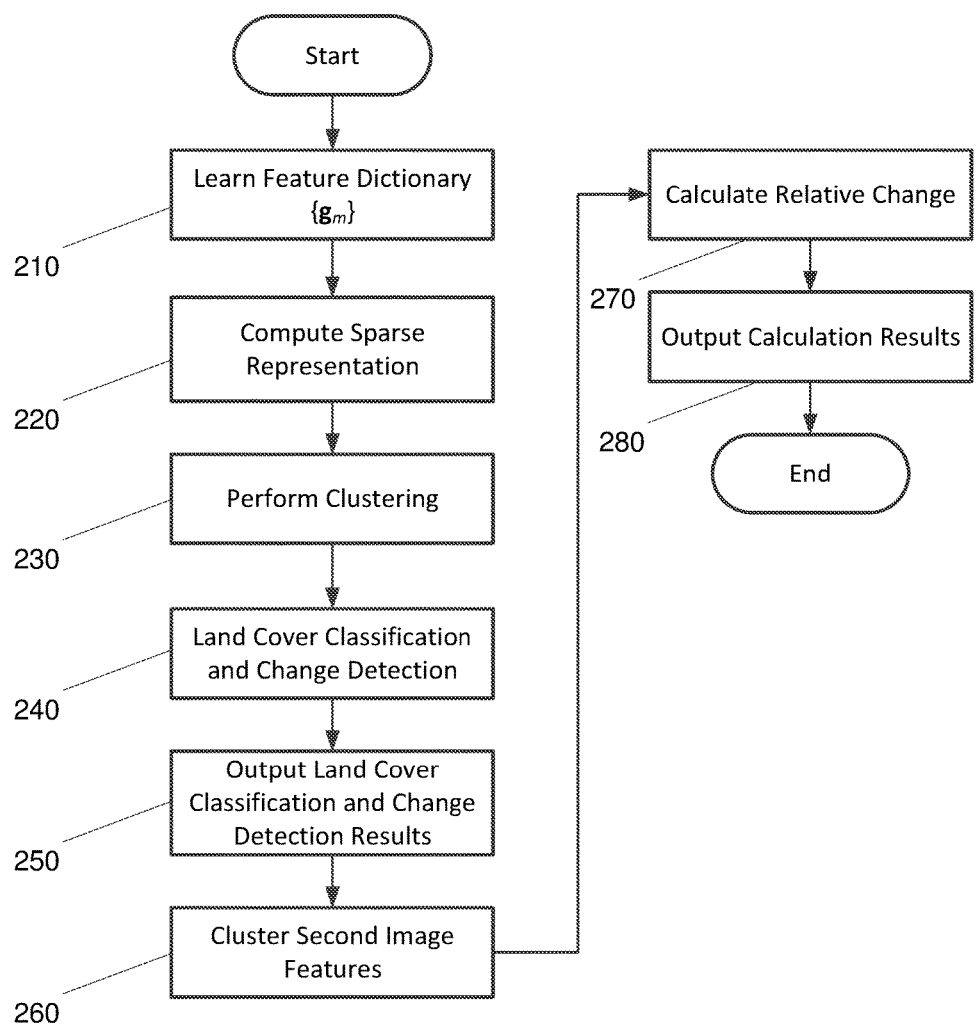
FIG. 2 is a flowchart illustrating a process for learning, categorizing, and identifying multispectral or hyperspectral, multiresolution features from satellite data, according to an embodiment of the present invention.

FIG. 2 is a flowchart illustrating a process 200 for learning, categorizing, and identifying multispectral or hyperspectral, multiresolution features from satellite data, according to an embodiment of the present invention. The process beings with learning representative land features at 210 to form a learned dictionary $\{g_m\}$. $\{g_m\}$ is learned by computing a dictionary in a frequency domain $\hat{g}_m$ $\forall m$ using $\hat{y}_{k,m}$ as coefficient maps, using an iterated Sherman-Morrison algorithm for a dictionary update, and outputting $\{g_m\}$ when stopping tolerances are met. In some embodiments, the dictionary learning is performed as discussed above with respect to FIG. 1.

In some embodiments, efficient convolutional sparse coding is derived in a frequency domain within an ADMM framework using FFTs. In certain embodiments, the learning of the representative land features further includes using available spectral bands in the image data in combinations to form normalized band difference indices. In some embodiments, a plurality of different spatial resolutions is used to learn multiple distinct dictionaries.

In some embodiments, the coefficient maps $\{y_m\}$ are determined with an efficiency of O(MN log N), where N is a dimensionality of the data and M is a number of elements in a dictionary. In certain embodiments, the coefficient maps $\{y_m\}$ are computed using only inner products, element-wise addition, and scalar multiplication as vector operations. In some embodiments, the dictionary in the frequency domain is concatenated as a set of block matrices and each block matrix is a diagonal.

A sparse representation is computed with respect to the learned dictionary at 220. The sparse representation of the features in the first image are clustered into land cover categories at 230. In some embodiments, the clustering of the features in the first image includes using unsupervised k-means clustering. Land cover classification and change detection are performed in the sparse domain after the first image is clustered at 240. In some embodiments, the change detection is performed by calculating a relative change given by Eq. (59) above. In certain embodiments, the change detection is determined by relative percent changes in label count including a change in area, given by Eq. (60) above. Results of the land cover classification and change detection in the sparse domain are then output at 250.

Features in a second image of the area taken at a second time are clustered at 260. A relative change in pixel labels and/or cluster size between clusters from the first image and clusters from the second image is calculated at 270. Results of the calculation of the relative change in the pixel labels and/or the cluster size are output at 280.

Figure 3:
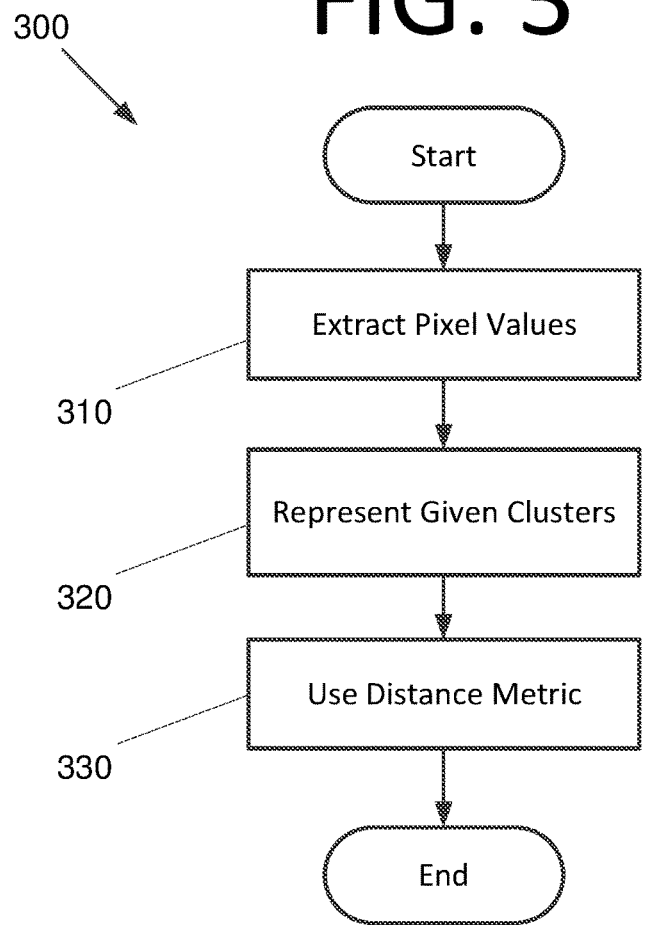
FIG. 3 is a flowchart illustrating a process for determining a separability and performance metric, according to an embodiment of the present invention.

FIG. 3 is a flowchart 300 illustrating a process for determining a separability and performance metric, according to an embodiment of the present invention. The process begins with extracting values for each pixel in a given cluster for available band indices R at 310, including NDVI, NDWI, NDSI, and NHFD band ratios. Given clusters are then represented in R-dimensional space at 320, such that the representations are defined by (NDVI, NDWI, NDSI, NHFD). A distance metric in a band difference index R-dimensional space is then used as a separability and performance metric at 330.

Figure 4:
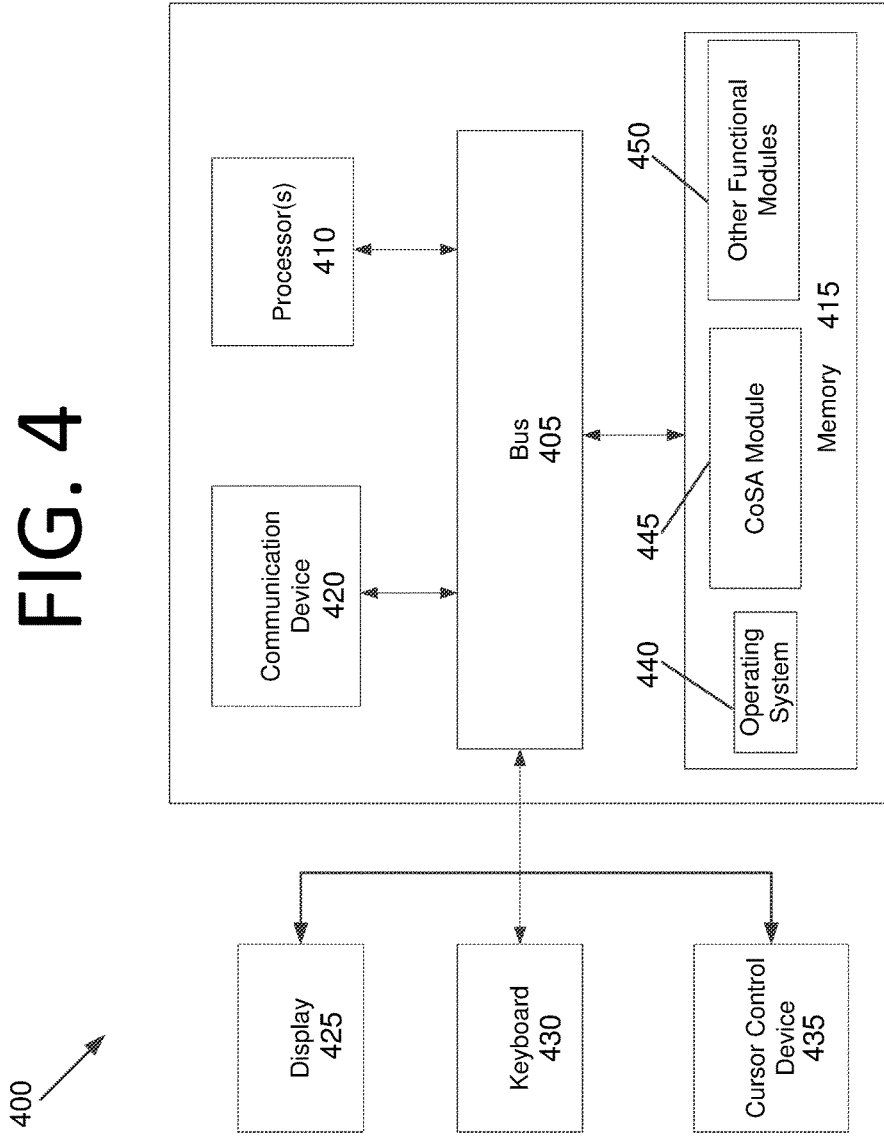
FIG. 4 is a block diagram of a computing system configured to learn, categorize, and identify multispectral or hyperspectral, multiresolution features from image data, according to an embodiment of the present invention.

FIG. 4 is a block diagram of a computing system 400 configured to learn, categorize, and identify multispectral or hyperspectral, multiresolution features from image data, according to an embodiment of the present invention. Computing system 400 includes a bus 405 or other communication mechanism for communicating information, and processor(s) 410 coupled to bus 405 for processing information. Processor(s) 410 may be any type of general or specific purpose processor, including a central processing unit ("CPU") or application specific integrated circuit ("ASIC"). Processor(s) 410 may also have multiple processing cores, and at least some of the cores may be configured to perform specific functions. Computing system 400 further includes a memory 415 for storing information and instructions to be executed by processor(s) 410. Memory 415 can be comprised of any combination of random access memory (RAM), read only memory (ROM), flash memory, cache, static storage such as a magnetic or optical disk, or any other types of non-transitory computer-readable media or combinations thereof. Additionally, computing system 400 includes a communication device 420, such as a transceiver and antenna, to wirelessly provide access to a communications network.

Non-transitory computer-readable media may be any available media that can be accessed by processor(s) 410 and may include both volatile and non-volatile media, removable and non-removable media, and communication media. Communication media may include computer-readable instructions, data structures, program modules or other data in a modulated data signal such as a carrier wave or other transport mechanism and includes any information delivery media.

Processor(s) 410 are further coupled via bus 405 to a display 425, such as a Liquid Crystal Display (LCD), for displaying information to a user. A keyboard 430 and a cursor control device 435, such as a computer mouse, are further coupled to bus 405 to enable a user to interface with computing system. However, in certain embodiments such as those for mobile computing implementations, a physical keyboard and mouse may not be present, and the user may interact with the device solely through display 425 and/or a touchpad (not shown). Any type and combination of input devices may be used as a matter of design choice.

Memory 415 stores software modules that provide functionality when executed by processor(s) 410. The modules include an operating system 440 for computing system 400. The modules further include a CoSA module 445 that is configured to learn, categorize, and identify multispectral or hyperspectral, multiresolution features from image data. Computing system 400 may include one or more additional functional modules 450 that include additional functionality.

One skilled in the art will appreciate that a "system" could be embodied as an embedded computing system, a personal computer, a server, a console, a personal digital assistant (PDA), a cell phone, a tablet computing device, or any other suitable computing device, or combination of devices. Presenting the above-described functions as being performed by a "system" is not intended to limit the scope of the present invention in any way, but is intended to provide one example of many embodiments of the present invention. Indeed, methods, systems and apparatuses disclosed herein may be implemented in localized and distributed forms consistent with computing technology, including cloud computing systems.

It should be noted that some of the system features described in this specification have been presented as modules, in order to more particularly emphasize their implementation independence. For example, a module may be implemented as a hardware circuit comprising custom very large scale integration ("VLSI") circuits or gate arrays, off-the-shelf semiconductors such as logic chips, transistors, or other discrete components. A module may also be implemented in programmable hardware devices such as field programmable gate arrays, programmable array logic, programmable logic devices, graphics processing units, or the like.

A module may also be at least partially implemented in software for execution by various types of processors. An identified unit of executable code may, for instance, comprise one or more physical or logical blocks of computer instructions that may, for instance, be organized as an object, procedure, or function. Nevertheless, the executables of an identified module need not be physically located together, but may comprise disparate instructions stored in different locations which, when joined logically together, comprise the module and achieve the stated purpose for the module. Further, modules may be stored on a computer-readable medium, which may be, for instance, a hard disk drive, flash device, RAM, tape, or any other such medium used to store data.

Indeed, a module of executable code could be a single instruction, or many instructions, and may even be distributed over several different code segments, among different programs, and across several memory devices. Similarly, operational data may be identified and illustrated herein within modules, and may be embodied in any suitable form and organized within any suitable type of data structure. The operational data may be collected as a single data set, or may be distributed over different locations including over different storage devices, and may exist, at least partially, merely as electronic signals on a system or network.

The process steps performed in FIGS. 1-3 may be performed by a computer program, encoding instructions for the nonlinear adaptive processor to perform at least the processes described in FIGS. 1-3, in accordance with embodiments of the present invention. The computer program may be embodied on a non-transitory computer-readable medium. The computer-readable medium may be, but is not limited to, a hard disk drive, a flash device, a random access memory, a tape, or any other such medium used to store data. The computer program may include encoded instructions for controlling the nonlinear adaptive processor to implement the processes described in FIGS. 1-3, which may also be stored on the computer-readable medium.

The computer program can be implemented in hardware, software, or a hybrid implementation. The computer program can be composed of modules that are in operative communication with one another, and which are designed to pass information or instructions to display. The computer program can be configured to operate on a general purpose computer, or an ASIC.

It will be readily understood that the components of various embodiments of the present invention as claimed, as generally described and illustrated in the figures herein, may be arranged and designed in a wide variety of different configurations. Thus, the detailed description of the embodiments of the present invention, as represented in the attached figures, is not intended to limit the scope of the invention, but is merely representative of selected embodiments of the invention.

The features, structures, or characteristics of the invention described throughout this specification may be combined in any suitable manner in one or more embodiments. For example, reference throughout this specification to "certain embodiments," "some embodiments," or similar language means that a particular feature, structure, or characteristic described in connection with the embodiment is included in at least one embodiment of the present invention. Thus, appearances of the phrases "in certain embodiments," "in some embodiment," "in other embodiments," or similar language throughout this specification do not necessarily all refer to the same group of embodiments and the described features, structures, or characteristics may be combined in any suitable manner in one or more embodiments.

It should be noted that reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussion of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize that the invention can be practiced without one or more of the specific features or advantages of a particular embodiment. In other instances, additional features and advantages may be recognized in certain embodiments that may not be present in all embodiments of the invention.

One having ordinary skill in the art will readily understand that the invention as discussed above may be practiced with steps in a different order, and/or with hardware elements in configurations which are different than those which are disclosed. Therefore, although the invention has been described based upon these preferred embodiments, it would be apparent to those of skill in the art that certain modifications, variations, and alternative constructions would be apparent, while remaining within the spirit and scope of the invention. In order to determine the metes and bounds of the invention, therefore, reference should be made to the appended claims.

The invention claimed is:

1. A computer-implemented method, comprising:
   learning representative land features, by a computing system, from multi-band images comprising image data to form a learned dictionary $\{g_m\}$;
   computing a sparse representation with respect to the learned dictionary;
   clustering features of the sparse representation of the image, by the computing system, into land cover categories;
   performing land cover classification and change detection in a sparse domain, by the computing system, after the image is clustered; and
   outputting results of the land cover classification and change detection in the sparse domain, by the computing system.

2. The computer-implemented method of claim 1, wherein the learning of the representative land features further comprises using available spectral bands in the image data in combinations to form normalized band difference indices.

3. The computer-implemented method of claim 1, wherein the clustering of the features in the image sparse representation comprises using unsupervised k-means clustering.

4. The computer-implemented method of claim 1, wherein a plurality of different spatial resolutions is used to learn multiple distinct dictionaries.

5. The computer-implemented method of claim 1, further comprising:
   extracting, by the computing system, values for each pixel in a given cluster for available band indices R, comprising a normalized difference vegetation index (NDVI), a normalized difference wetness index (NDWI), a normalized difference soil index (NDSI), and a nonhomogeneous feature distance (NHFD) band ratio;
   representing the given cluster, by the computing system, in R-dimensional space, such that the representation is defined by (NDVI, NDWI, NDSI, NHFD); and
   using, by the computing system, a distance metric in a band difference index R-dimensional space as a separability and performance metric.

6. The computer-implemented method of claim 1, wherein the change detection is performed by calculating a relative change given by:

relative_change=(cluster_size$_{t_2}$−cluster_size$_{t_1}$)/cluster_size$_{t_1}$ where time $t_2$ is subsequent to time $t_1$.

7. The computer-implemented method of claim 1, wherein the change detection is determined by relative percent changes in label count comprising a change in area, given by:

$$\text{area\_change} = \left(cluster_{size_{t_2}} - cluster_{size_{t_1}}\right) \times \text{pixel\_area}$$

8. The computer-implemented method of claim 1, further comprising:
   interleaving updates, by the computing system, on sparse coding and dictionary learning such that $g_m$ represent the dictionary in sparse coding steps and $y_{k,m}$ represent sparse coding in dictionary steps; and
   outputting coefficient maps $\{y_m\}$, by the computing system, when the stopping tolerances are met.

9. The computer-implemented method of claim 8, further comprising:
   deriving efficient convolutional sparse coding in a frequency domain, by the computing system, within an alternating direction method of multipliers (ADMM) framework using fast Fourier transforms (FFTs).

10. The computer-implemented method of claim 9, wherein the coefficient maps $\{y_m\}$ are determined with an efficiency of O(MN log N), where N is a dimensionality of the data and M is a number of elements in a dictionary.

11. The computer-implemented method of claim 9, wherein the coefficient maps $\{y_m\}$ are computed using only inner products, element-wise addition, and scalar multiplication as vector operations.

12. The computer-implemented method of claim 1, wherein the dictionary in the frequency domain is concatenated as a set of block matrices and each block matrix is a diagonal.

13. The computer-implemented method of claim 1, further comprising:
    clustering, by the computing system, features in a first image of an area taken at a first time and cluster features in a second image of the area taken at a second time, wherein the second time is after the first time;
    calculating, by the computing system, a relative change in pixel labels and/or cluster size between clusters from the first image and clusters from the second image; and
    outputting, by the computing system, results of the calculation of the relative change in the pixel labels and/or the cluster size.

14. A computer program embodied on a non-transitory computer-readable medium, the program configured to cause at least one processor to:
    form a learned dictionary by computing the dictionary in a frequency domain by using coefficient maps, using an iterated Sherman-Morrison algorithm for a dictionary update, and output a dictionary when stopping tolerances are met;
    compute a sparse representation with respect to the learned dictionary;
    cluster feature vectors extracted from the sparse representation into land cover categories;
    perform land cover classification and change detection in a sparse domain after the image is clustered; and
    output results of the land cover classification and change detection in the sparse domain.

15. The computer program of claim 14, wherein a plurality of different spatial resolutions is used to learn distinct dictionaries.

16. The computer program of claim 14, wherein the program is further configured to cause the at least one processor to:
    extract values for each pixel in a given cluster for available band indices R, comprising a normalized difference vegetation index (NDVI), a normalized difference wetness index (NDWI), a normalized difference soil index (NDSI), and a nonhomogeneous feature distance (NHFD) band ratio;
    represent the given cluster in R-dimensional space, such that the representation is defined by (NDVI, NDWI, NDSI, NHFD); and use, a distance metric in a band difference index R-dimensional space as a separability and performance metric.

17. The computer program of claim 15, wherein the program is further configured to cause the at least one processor to:
   interleave updates on sparse coding and dictionary learning; and
   output coefficient maps when the stopping tolerances are met.

18. The computer program of claim 1, wherein the dictionary in the frequency domain is concatenated as a set of block matrices and each block matrix is a diagonal.

19. An apparatus, comprising:
   memory storing computer program instructions; and
   at least one processor configured to execute the stored computer program instructions, wherein the at least one processor, by executing the stored computer program instructions, is configured to:
      form a learned dictionary by computing the dictionary in a frequency domain by using coefficient maps, using an iterated Sherman-Morrison algorithm for a dictionary update, and output a dictionary when stopping tolerances are met,
      compute a sparse representation with respect to the learned dictionary,
      perform land cover classification and/or change detection in a sparse domain, and
      output results of the land cover classification and/or change detection in the sparse domain.

20. The apparatus of claim 19, wherein the dictionary in the frequency domain is concatenated as a set of block matrices and each block matrix is a diagonal.

* * * * *